United States Patent [19]

Hall

[11] 4,396,900

[45] Aug. 2, 1983

[54] THIN FILM MICROSTRIP CIRCUITS

[75] Inventor: Ronald D. Hall, Baltimore, Md.

[73] Assignee: The United States of America as represented by the Secretary of the Navy, Washington, D.C.

[21] Appl. No.: 355,831

[22] Filed: Mar. 8, 1982

[51] Int. Cl.³ .......................................... H01C 1/012
[52] U.S. Cl. ...................................... 338/309; 29/620;
156/656; 219/543; 338/327; 338/328; 351/71;
427/89; 428/607
[58] Field of Search ............... 338/307, 308, 309, 320,
338/326, 327, 328, 329, 330; 219/541, 543;
174/DIG. 5; 29/619, 590, 620, 621; 427/89;
156/650, 656, 657; 428/607, 627, 601, 621;
357/71

[56] References Cited

U.S. PATENT DOCUMENTS

| | | | |
|---|---|---|---|
| 3,296,574 | 1/1967 | Tassara | 338/309 |
| 3,381,256 | 4/1968 | Schuller et al. | 338/309 |
| 3,387,952 | 6/1968 | Chapelle | 428/627 |
| 3,423,260 | 1/1969 | Heath et al. | 156/650 |
| 3,476,531 | 11/1969 | Brewer et al. | 428/607 |
| 3,495,959 | 2/1970 | Johnson, Jr. | 428/607 |
| 3,496,513 | 2/1970 | Helgeland | 338/308 |
| 3,607,476 | 9/1971 | Basseville et al. | 156/650 |
| 3,813,519 | 5/1974 | Zochim et al. | 219/543 X |
| 3,823,348 | 7/1974 | Agusta et al. | 357/71 X |
| 3,849,757 | 11/1974 | Khammous et al. | 338/309 X |
| 3,881,884 | 5/1975 | Cook et al. | 29/590 |
| 4,117,589 | 10/1978 | Francis et al. | 29/619 |
| 4,164,607 | 8/1979 | Thiel et al. | 428/621 |

OTHER PUBLICATIONS

Aland, "Metal Contacts for Carmat Film Resistors", *IBM Technical Disclosure Bulletin*, vol. 9, No. 6, Nov. 1966, p. 581.

*Primary Examiner*—Volodymyr Y. Mayewsky

[57] ABSTRACT

A four layer thin film metallization system is comprised of layers of tantalum, chromium, copper and gold and is useful in high resolution, low loss microstrip circuits. The metallization system is compatible with lead-tin solder and, in addition, provides low insertion losses at X-band frequencies.

1 Claim, 2 Drawing Figures

THIN FILM MICROSTRIP CIRCUITS

BACKGROUND OF THE INVENTION

The present invention relates to thin film microstrip circuits and more particularly to a thin film circuit that is compatible with lead-tin solder and which provides low insertion loss at X-band frequency.

Thin film microstrip circuits are presently fabricated primarily from metallization systems consisting of gold as the main conductor. A typical system has a layer of tantalum acting as an adhesive layer and resistor metal followed by a thin layer of chromium acting as a diffusion barrier, and finally a layer of gold acting as the main conductor. Because of the high conductivity of gold, the insertion loss at X-band frequency is low. The inherent chemical inertness of gold also makes it desirable as the outer metallization when considering oxidation and corrosion problems. The photofabrication processes for etching gold based thin film circuits are well defined and capable of yielding circuitry with line widths and spacings of 1 mil for gold films on the order of 50,000 Angstroms thick. The etchants used respectively for etching gold, chromium and tantalum do not interact with the other metals, and therefore high resolution of etched circuitry is possible. However, gold based circuitry must be soldered with lead-indium solder because of solder leaching of the gold by tin based solders. Recent discovery of corrosion and cracking of lead-indium solder joints has made it necessary to develop alternative metallization systems which are compatible with lead-tin solders, but which also exhibit acceptable transmission reflection parameters at high frequencies and which are still compatible with fabrication of tantalum thin film resistors.

Proposed solutions, such as tantalum-nickel-gold or tantalum-palladium-gold are desirable in terms of lead-tin solderability and their resistance to solder leaching. However, because of the use of lower conductivity metals such as nickel and palladium in closer proximity to the substrate surface than the gold, insertion losses at X-band frequency are relatively high.

SUMMARY OF THE INVENTION

The present invention relates to a thin film metallization system for microstrip circuits and more particularly to a thin film circuit which can be soldered with lead-tin solders.

A four layer circuit pattern is made by successively depositing, on a substrate, layers of tantalum, chromium, copper and gold and then the desired circuit pattern is made by etching procedures. The circuit pattern, in addition to being compatible with lead-tin solders, also has low insertion losses at X-band frequencies.

It is therefore a general object of the present invention to provide an improved thin film metallization system for high resolution, low loss microstrip circuits.

Other objects, advantages and novel features of the present invention will become apparent from the following detailed description of the invention when considered in conjunction with the accompanying drawing.

DESCRIPTION OF THE PREFERRED EMBODIMENT

Figure 1:
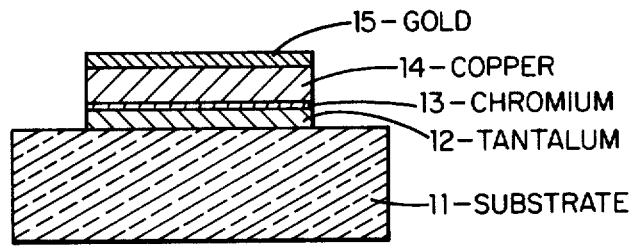
FIG. 1 is a sectional view of a microstrip circuit embodying the present invention.

Referring to FIG. 1 of the drawing, a metallization system is shown having 1500 Angstroms of tantalum 12 to provide a 50 ohms per square thin film resistor on a substrate 11. Next, 200 Angstroms of chromium 13 is provided as a diffusion barrier between tantalum 12 and 50,000 Angstroms of copper 14, which serves as the primary conductor. Then 7,000 Angstroms of gold 15 are provided on the layer of copper 14, and this layer of gold 15 provides oxidation protection.

By way of example, the 1500 Angstroms of tantalum 12 might be vapor deposited in a vacuum chamber on substrate 11 by an electron beam gun at a rate of 20 Angstroms per second while substrate 11 is maintained at a temperature of 250 degrees C. The tantalum film is preferably "doped" with oxygen by bleeding oxygen into the vapor stream at a rate of 0.5 cc per second so that the vacuum chamber pressure is about $3 \times 10^{-5}$ torr. Next, the 200 Angstroms of chromium 13 can be deposited at a rate of 10 Angstroms per second while substrate 11 is still maintained at a temperature of 250 degrees C. The preferred chamber pressure during chromium deposition is $3 \times 10^{-6}$ torr. Copper 14 can be deposited at a rate of 50 Angstroms per second and gold 15 can be deposited at a rate of 25 Angstroms per second and substrate 11 is still maintained at a temperature of 250 degrees C. and the chamber pressure is maintained at $3 \times 10^{-6}$ torr. The four metals, that is tantalum 12, chromium 13, copper 14 and gold 15 can be deposited during a single pumpdown of the vacuum chamber by using a movable four pocket electron beam hearth thereby eliminating problems of oxidation and contamination of intermediate metal interfaces.

After the deposition of gold 15, substrate 11 is removed from the vacuum chamber and can be prepared for circuit and resistor pattern etching. The etching of a four layer metallization system greatly increases the complexity of an etching process. The main problems encountered are undercutting of an upper metal layer when etching a lower metal layer, a greater problem of chemical attach on the photo resist because of more etchants needed, a greater probability of metal etching interaction where the etchant for one metal will also etch one of the other metals in the system and finally, etching the intermettalics that often exist at the boundary between one metal and another. To counteract these problems, careful attention must be paid to choice of etchants, their concentrations, temperatures, and the etching rates, since a faster etch rate is not always the more beneficial in terms of undercutting produced.

By way of example, the circuit pattern can be defined by standard photolithography techniques resulting in dryfilm resist material protecting all areas designated for circuit tracks. Gold 15 can be etched in Metex Gold Etchant solution at a temperature of 35–40 degrees C., with agitation. The approximate etching time for 7000 Angstroms of gold is two minutes. Copper 14 can be etched with a 25 percent ammonium persulfate solution having a temperature of 110 degrees F. The solution is preferably sprayed onto the surfaces to minimize undercutting and the approximate etching time for 50,000 Angstroms of copper is 15 seconds. Next, the chromium 13 is etched in a 10 percent sodium hydroxide-10 percent potassium ferricyanide in water at a temperature of 40 degrees C., with agitation. The approximate etching time for 200 Angstroms of chromium is 15 seconds.

Tantalum 12 can be etched in a solution consisting of 300 ml of water, 150 ml of hydrofluoric acid and 50 mil of nitric acid at room temperature with no agitation.

Figure 2:
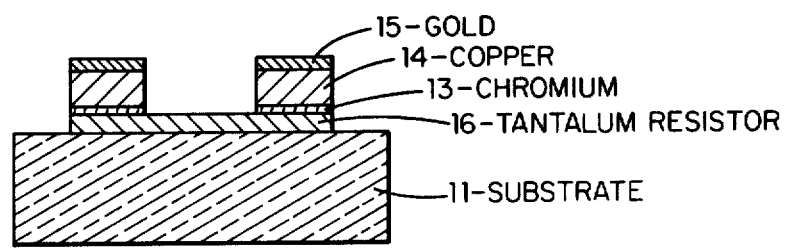
FIG. 2 is a sectional view similar to FIG. 1 showing a tantalum resistor.

Referring now to FIG. 2 of the drawing, there is shown a tantalum resistor 16 which has layers of chromium, copper and gold at each end. The four metals were deposited on substrate 11, as discussed above, and the gold, copper and chromium were etched away, however, the layer of tantalum is left which forms the resistor itself.

Circuits made according to the teachings of the present invention have been made and tested and found to be compatible with 60/40 lead-tin solder and show an improvement of shear strength.

It can thus be seen that the present invention provides an improved metallization system for use with microstrip circuits and provides a product that is compatible with lead-tin solder and has low insertion losses at X-band frequencies.

I claim:

1. A thin film microstrip circuit having low insertion loss at X-band frequency and being highly solderable with lead-tin solder comprising,
   a non-metallic substrate,
   a layer of tantalum fused onto said substrate,
   a layer of chromium having a thickness of about 200 Angstroms fused onto said layer of tantalum,
   a layer of copper having a thickness of about 50,000 Angstroms fused onto said layer of chromium, and
   a layer of gold having a thickness of about 7,000 Angstroms fused onto said layer of copper.

* * * * *